(12) United States Patent
Shivaram et al.

(10) Patent No.: US 8,860,589 B1
(45) Date of Patent: Oct. 14, 2014

(54) BUILT-IN SELF-HEALING WITHOUT ADDED PHYSICAL REDUNDANCY IN TIME-INTERLEAVED ADCS

(71) Applicant: Semtech Corporation, Camarillo, CA (US)

(72) Inventors: Krishna Shivaram, Torrance, CA (US); Sandeep Louis D'Souza, Redondo Beach, CA (US); Craig Allison Hornbuckle, Rolling Hills Estates, CA (US)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 13/944,829

(22) Filed: Jul. 17, 2013

(51) Int. Cl.
*H03M 1/06* (2006.01)

(52) U.S. Cl.
CPC .................................. *H03M 1/0617* (2013.01)
USPC ........................................... 341/118; 341/159

(58) Field of Classification Search
CPC ..................... H03M 2201/63; H03M 2201/64; H03M 2201/65; H03M 1/1225; H03M 1/0617; H03M 13/27
USPC .................. 341/118, 120, 155, 161, 141, 122
See application file for complete search history.

(56) References Cited

U.S. PATENT DOCUMENTS

| | | | | |
|---|---|---|---|---|
| 5,579,006 A * | 11/1996 | Hasegawa et al. | ............ | 341/162 |
| 6,437,713 B1 * | 8/2002 | Lesea | ............... | 341/78 |
| 6,667,704 B1 * | 12/2003 | Grale et al. | ................... | 341/123 |
| 7,049,872 B2 * | 5/2006 | Diorio et al. | .................. | 327/276 |
| 7,786,786 B2 * | 8/2010 | Kirichenko | ................... | 327/295 |
| 7,932,845 B2 * | 4/2011 | Sheng et al. | .................. | 341/120 |

* cited by examiner

*Primary Examiner* — Peguy Jean Pierre
(74) *Attorney, Agent, or Firm* — McDermott Will & Emery LLP

(57) ABSTRACT

Examples are provided for a time-interleaved analog-to-digital converter (ADC) with built-in self-healing. The ADC may include multiple ADC slices. Each ADC slice may be configured to operate in one of a normal or a healing mode of operation. In the normal mode of operation, each ADC slice may convert an input analog signal to a single digital output signal in response to a clock signal associated with the ADC slice. In the healing mode of operation, each ADC slice may be operable to convert the input analog signal to two or more digital output signals in response to two or more clock signals. One or more of the digital output signals may replace one or more output signals of failed ADC slices. A first clock signal may be associated with the ADC slice. A second clock signal may be associated with another ADC slice of the plurality of ADC slices.

20 Claims, 8 Drawing Sheets

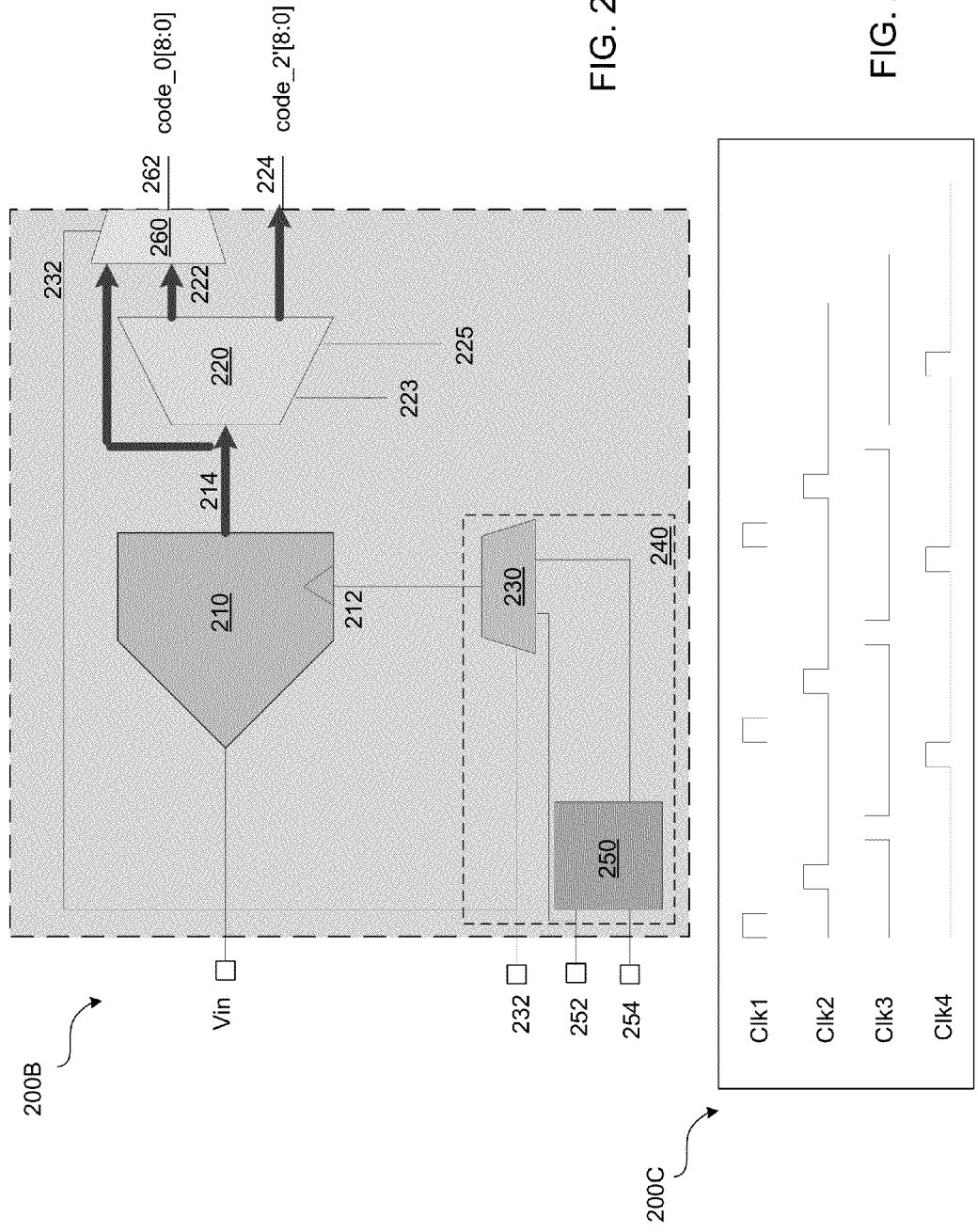

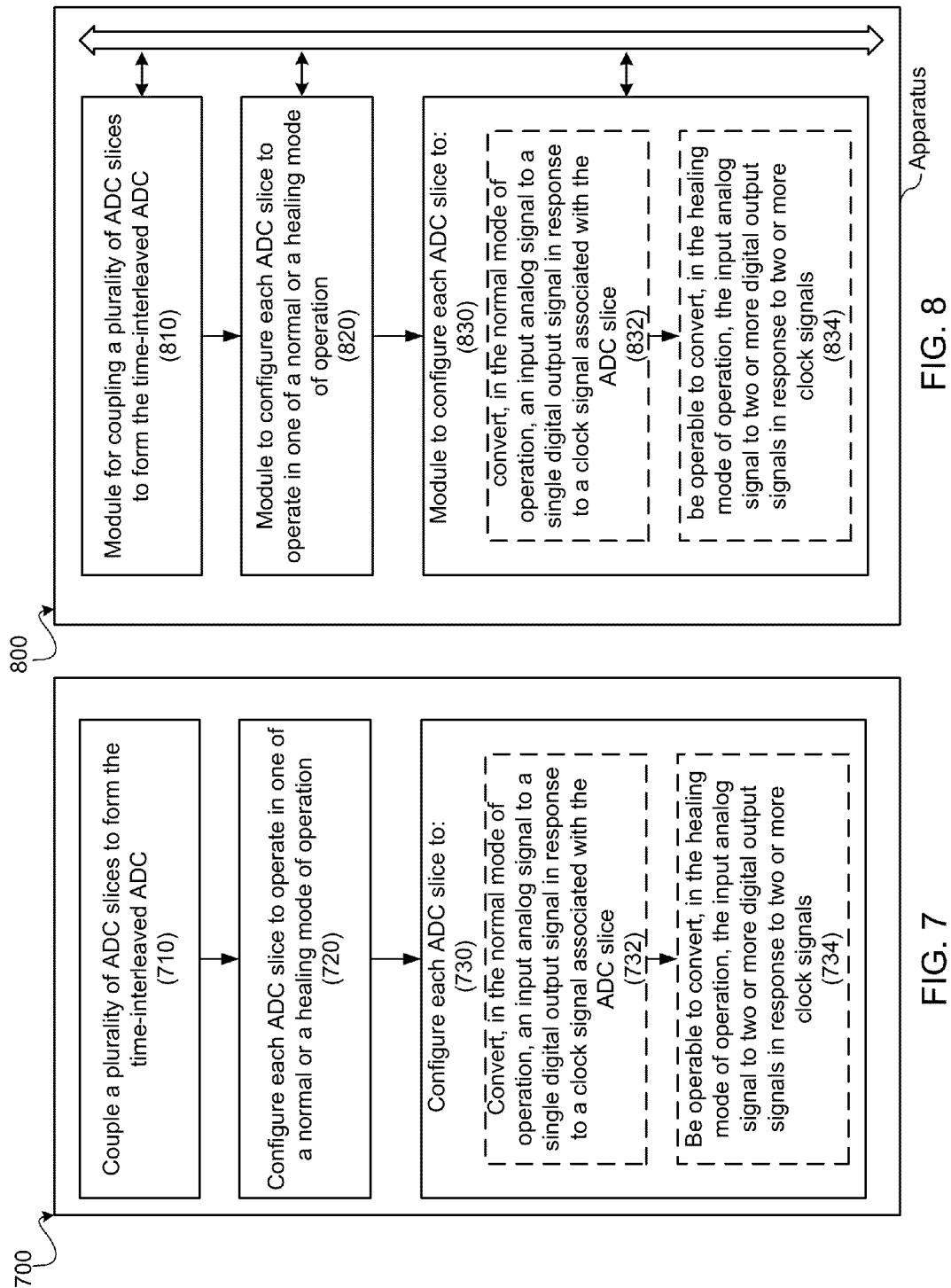

US 8,860,589 B1

BUILT-IN SELF-HEALING WITHOUT ADDED PHYSICAL REDUNDANCY IN TIME-INTERLEAVED ADCS

FIELD

The disclosure relates in general to mixed signal systems, and more particularly, to built-in self-healing without added physical redundancy in time-interleaved ADCs.

BACKGROUND

Many systems such as digital and mixed signal systems may include multiple similar units. For example, a mixed signal system such as a communication system (e.g., a 100 GHz coherent transceiver) may be subdivided into one or more sub-systems including analog-to-digital converters (ADCs), digital-to-analog converters (DACs), and/or serializer-deserializers (SerDes). Each of the subsystems may, in turn, consist of a number of similar units. For instance, an ADC may be built with hundreds of (e.g., 512 or more) successive-approximation register (SAR) units. A serious concern in such multi-unit systems is the system-level effect of any failure in one or more of the units of the multi-unit system. For example, even one bad SAR unit in an ADC with multiple SAR units may significantly impact the effective number of bits (SNOB) of the ADC.

SUMMARY

In one aspect of the disclosure, examples are provided for a time-interleaved analog-to-digital converter (ADC) with built-in self-healing. An example circuit for the time-interleaved ADC may include multiple ADC slices. Each ADC slice may be configured to operate in one of a normal or a healing mode of operation. In the normal mode of operation, each ADC slice may convert an input analog signal to a single digital output signal in response to a clock signal associated with the ADC slice. In the healing mode of operation, each ADC slice may be operable to convert the input analog signal to two or more digital output signals in response to two or more clock signals. One or more of the digital output signals may replace one or more output signals of failed ADC slices. A first clock signal may be associated with the ADC slice. A second clock signal may be associated with another ADC slice of the plurality of ADC slices.

In another aspect of the disclosure, an example method for self-healing in a time-interleaved analog-to-digital converter may include coupling multiple ADC slices to form the time-interleaved ADC. Each ADC slice may be configured to operate in one of a normal or a healing mode of operation. In the normal mode of operation, each ADC slice may be configured to convert an input analog signal to a single digital output signal in response to a clock signal associated with the ADC slice, and be operable to convert, in the healing mode of operation, the input analog signal to two or more digital output signals in response to two or more clock signals. One or more of the digital output signals may be configurable to replace one or more output signals of the failed ADC slices. A first clock signal of the two or more clock signals may be the clock signal associated with the ADC slice, and a second clock signal of the two or more clock signals may be associated with another ADC slice of the multiple ADC slices.

In yet another aspect of the disclosure, a non-transitory machine-readable medium may include instructions stored therein, the instructions may be executable by one or more processors to facilitate performing a method for self-healing in a time-interleaved analog-to-digital converter (ADC). The method may include coupling multiple ADC slices to form the time-interleaved ADC; configuring each ADC slice to operate in one of a normal or a healing mode of operation; and configuring each ADC slice to convert, in the normal mode of operation, an input analog signal to a single digital output signal in response to a clock signal associated with the ADC slice; and be operable to convert, in the healing mode of operation, the input analog signal to two or more digital output signals in response to two or more clock signals. Wherein, one or more of the digital output signals may be configurable to replace one or more output signals of the failed ADC slices, a first clock signal of the two or more clock signals may be the clock signal associated with the ADC slice, and a second clock signal of the two or more clock signals may be associated with another ADC slice of the multiple ADC slices.

It is understood that various configurations of the subject technology will become readily apparent to those skilled in the art from the disclosure, wherein various configurations of the subject technology are shown and described by way of illustration. As will be realized, the subject technology is capable of other and different configurations and its several details are capable of modification in various other respects, all without departing from the scope of the subject technology. Accordingly, the summary, drawings and detailed description are to be regarded as illustrative in nature and not as restrictive.

BRIEF DESCRIPTION OF THE DRAWINGS

FIGS. 2A-2C are diagrams of examples of ADC slices of a self-healing time-interleaved ADC and an example of a time diagram of the corresponding clock signals.

FIG. 7 is a diagram illustrating an example of a method for self-healing in a time-interleaved analog-to-digital converter.

FIG. 8 is a diagram illustrating an exemplary apparatus including modules of a self-healing time-interleaved ADC.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding. Please note that the term "example" is used herein as a noun or an adjective.

The subject technology is directed to self-healing in a mixed-signal system (e.g., an analog-to-digital converter (ADCs), a digital-to-analog converter (DAC), or a serializer-deserializers (SerDes)) including a number of similar subsystems without added physical redundancy. In such multi-unit systems, the production yield of the multi-unit system may be seriously affected by the yield of the individual units. For instance, in an ADC built with hundreds of (e.g., 512 or more) successive-approximation register (SAR) units, a yield of 60% for an ADC with 32-SAR units may require a yield of approximately 99.9% for the individual SAR units. The yield of the individual SAR units may be impacted by, for instance, high speed comparator resolution, comparator offset cancellation range, process variation of capacitances of the array capacitors, etc. The electronic redundancy of the subject technology can drastically reduce the required yield of a SAR unit, as compared to various physical redundancy schemes, and can result in reduced production cost. The disclosed technology may provide a high yield enhancement for the added area due to an additional small area clock circuit.

Figure 1:
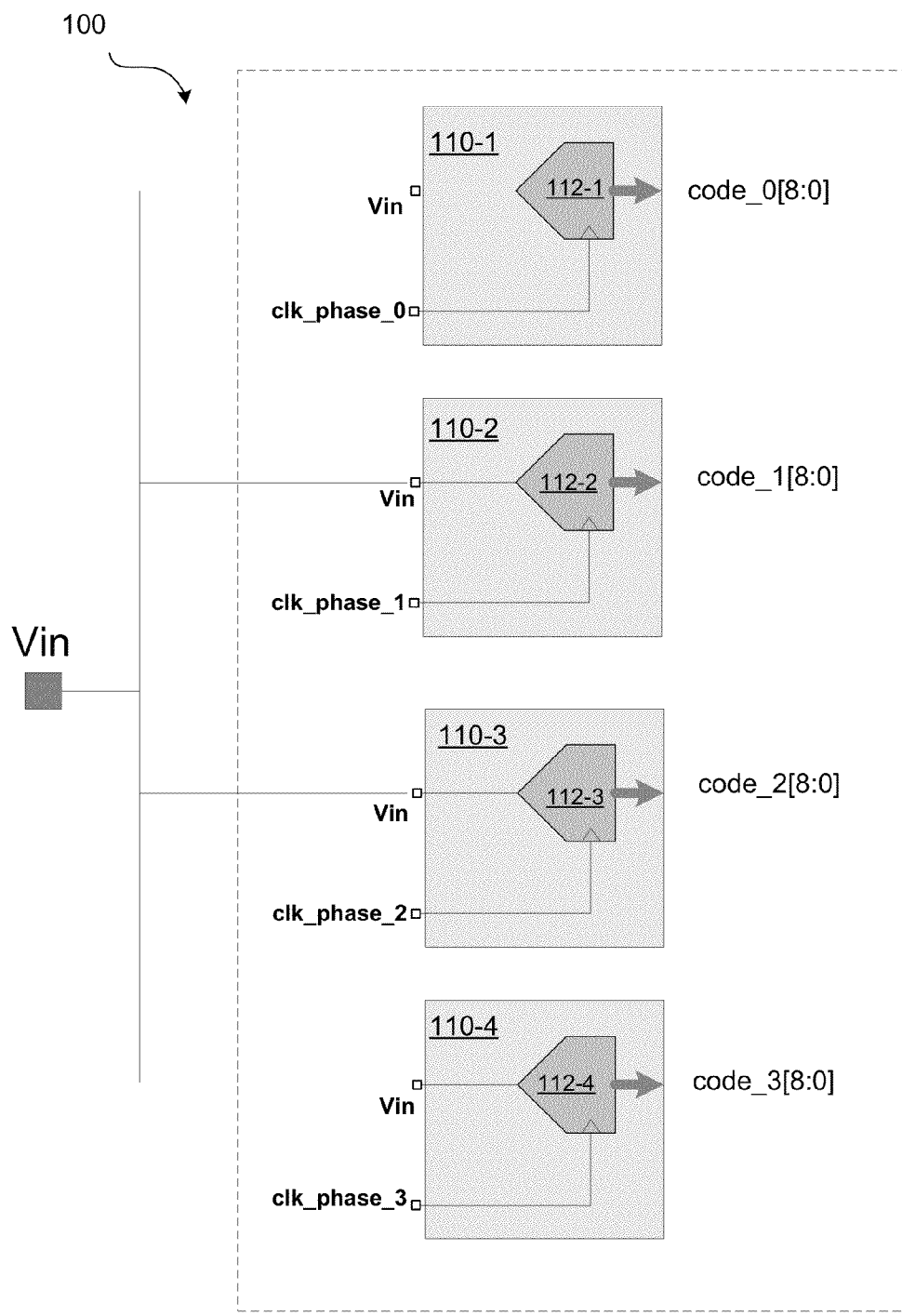
FIG. 1 is a block diagram of an example of a time-interleaved analog-to-digital converter (ADC) quad without redundancy.

FIG. 1 is a block diagram of an example of a time-interleaved analog-to-digital converter (ADC) quad 100 without redundancy. The ADC quad 100 includes four ADC slices 110-1 to 110-4. Each ADC slice 110 may include a SAR unit 112 (e.g., one of 112-1 to 112-4) which can operate at a reduced sampling rate as compared to the frequency of the input signal Vi. For example, for an input signal frequency of 2 GHz, each of the SAR units 112 may operate at 500 MS/sec. The reduced sampling rate is made possible by using clock signals at the reduced frequency with various phase angles. For example, the clock pulses applied to the SAR units 112 may be 500 MHz clock pulses at phases denoted by indices 0, 1, 2, and 3. The four phases of the clock pulses may, for instance, include 0, 90, 180, and 270 degrees. Each of the ADC slices 110 may generate a digital output signal (e.g., one of code_0 to code-3). In the example shown in FIG. 1, each of the ADC slices may generate a 9-bit output signal (e.g., [8:0]) at 500MS/s, which are generated from samples taken at four different phase angles from the 2 GHz input signal Vin of each ADC slice 110.

The quad ADC 100 does not have any physical or other redundancies. An implication of the lack of any redundancy in the ADC quad 100 is that if one of the ADC slices 110 fails for any reason, the effective number of bit (ENOB) of the quad ADC 100 may be drastically affected. For example, a simulation of a typical 9-bit quad ADC shows that a bad SAR slice 110 may reduce the ENOB to an unacceptably low value of approximately 3.2. A physical redundancy scheme such as a five-for-four, which adds a redundant ADC slice that can replace a bad ADC slice of the four ADC slices 110, may improve the ENOB, but at the price of additional chip area and cost. The subject technology can significantly improve the ENOB by a self-healing electronic redundancy scheme, without added physical redundancy, as discussed in greater detail herein.

Figure 2A:
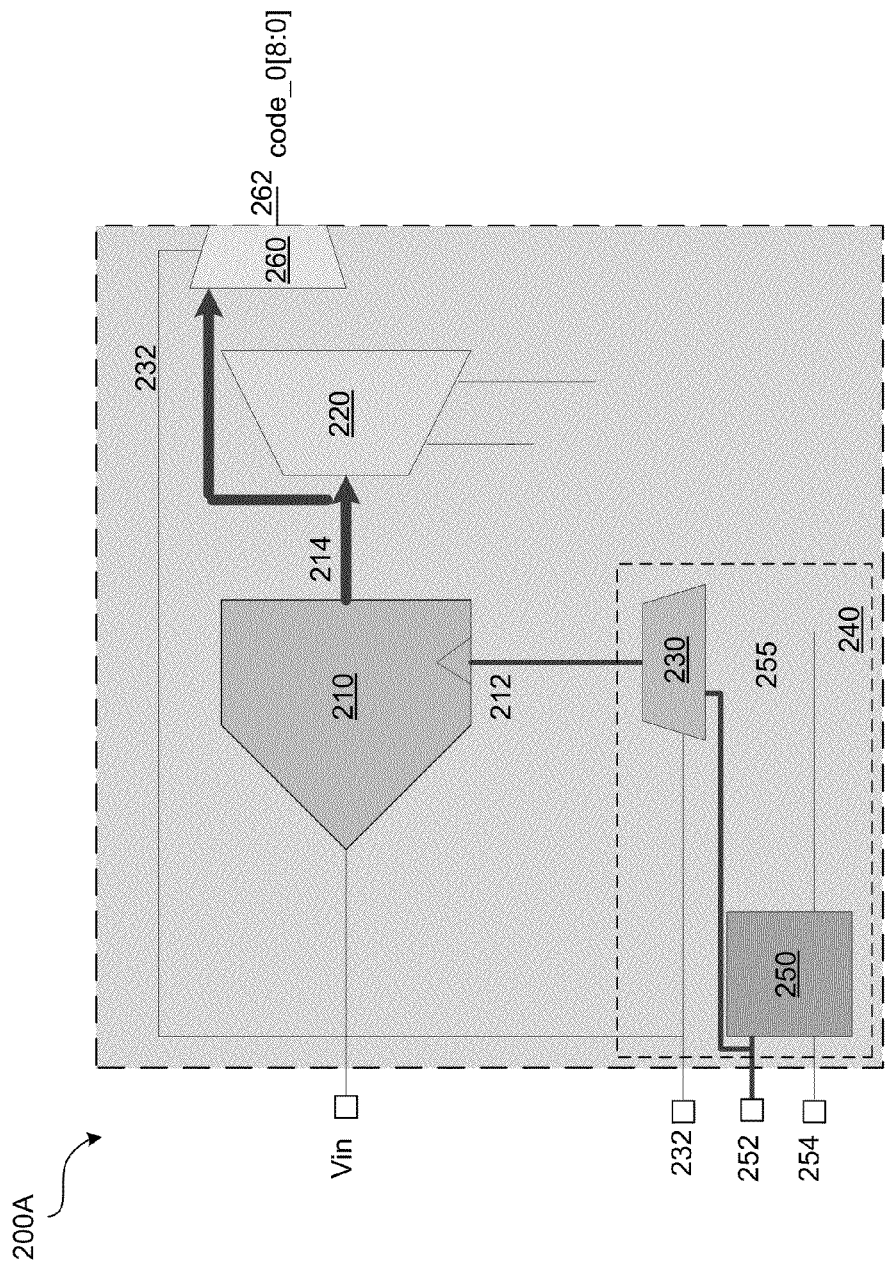

FIGS. 2A-2C are diagrams of examples of ADC slices of a self-healing time-interleaved ADC and an example of a time diagram of the corresponding clock signals. In the disclosed electronic redundancy scheme, each ADC slice of an ADC (e.g., a quad ADC) may operate in one of a normal or healing (e.g., self-healing) mode of operation. In the normal mode of operation, an input analog signal Vin may be converted by an ADC slice to a single digital output signal, in response to a clock signal associated with the ADC slice. In the healing mode of operation, each ADC slice may convert the input analog signal Vin to two (or more) digital output signals in response to two (or more) clock signals, as further discussed herein.

FIG. 2A shows an example of an ADC slice 200A of an ADC (e.g., a quad ADC) operating in the normal mode of operation. The ADC slice 200 includes a SAR unit 210, digital demultiplexer 220, a clock circuit 240, and a multiplexer 260. In one or more aspects, the clock circuit 240 may include a logic gate 250 (e.g., an OR gate) and a clock selector 230. The input signal may be an analog input signal at, for example, 2 GHz. The OR gate 250 may generate a double-rate clock signal 255 from two phases including a phase-0 clock signal 252 and a phase-2 clock signal 254 derived from an input clock signal with an input clock rate. The input clock rate may, for example, be 500 MHz and the two phases (e.g., phase-0 and phase-2) may include 0 and 180 degrees. In this case, the double-rate clock signal 255 generated by the OR gate may be a 1 GHz clock signal.

In the normal mode of operation, the mode select input 232 may cause the clock selector 230 to pass the phase-0 clock signal 252 to the clock input 212 of the SAR unit 210. Therefore, the SAR unit 210 may operate at the input clock rate (e.g., 500 MHz) and generate a single digital output signal 214, which may bypass the digital demultiplexer 220 and enter the multiplexer 260. The multiplexer 260 may be controlled by the mode select signal 232, which in the normal mode of operation allows the multiplexer 260 to pass the single digital output signal 214 as the digital output signal 262 (e.g., 9-bit code [8:0]) of the ADC slice 200A.

FIG. 2B shows an example of an ADC slice 200B of the ADC (e.g., the quad ADC) operating in the healing mode of operation. The ADC slice 200B is the same as the ADC slice 200A discussed above, which is shown again here to describe the healing mode of operation. In the healing mode of operation, the ADC slice 200B can provide an additional digital output signal 224 that can replace a lost digital output signal of a defective ADC slice of the quad ADC. In the healing mode of operation, the mode select signal 232 causes the clock selector 230 to pass the double-rate clock signal 255 to the clock input 212 of the SAR unit 210. Consequently, the SAR unit 210 operates at a double-rate (e.g., 1 GS/s), which is double the rate of the input clock signal (e.g., 252 or 254), and generate the digital output signal 214 at the double-rate.

The digital demultiplexer 220 may use two clock pulses 223 and 225 (e.g., clock signal 252 and an inverted version of the clock signal 252) to demultiplex the digital output signal 214 into two digital output signals 222 and 224, each at the rate of the input clock signal (e.g., 500 MS/s). The digital output signal 222 may be selected by the multiplexer 260 as the digital output signal 262 of the ADC slice 200B. The selection is made possible by the mode select signal 232, which, in the healing mode of operation, causes the multiplexer 260 to select the digital output signal 222, rather than the digital output signal 214. Therefore, in the healing mode of operation, the ADC slice generates two digital output signals 262 and 224. The digital output signals 262 is the same as the digital output signals 262 produced by the ADC slice 220A (e.g., in the normal mode) and is used as the digital output signal of the ADC slice 200B.

The digital output signals 224 may be at a phase angle (e.g., 180 degrees) with respect to the digital output signals 262 and may be used as an electronically generated redundant output signal instead of a lost output signal of a defective SAR slice of a quad ADC that the ADC slice 200B (or 200A) is a part of. The ADC slices of the subject technology (e.g., ADC slices 200A and 200B) are different from the existing ADC slices by just the clock circuit 240. In other words, the disclosed technology provides the functionality of a redundant ADC slice by an electronic redundancy scheme at the price of adding a small area clock circuit (e.g., 240). Therefore, the disclosed solution can drastically reduce area and cost, in particular for large ADCs including many (e.g., hundreds such 512) ADC slices.

The time diagram 200C shows exemplary clock signals corresponding to the ADC slices 200A and 200B and an associated quad ADC. For example, clock signals Clk1 and Clk3 are at 0 and 180 degrees phase angles and can be used as the clock signals 252 and 254, respectively. The clocks signals Clk2 and Clk4 are at the 90 and 270 degrees phase angle and can be used for other ADC slices of a quad ADC as discussed below with respect to FIG. 3.

Figure 3:
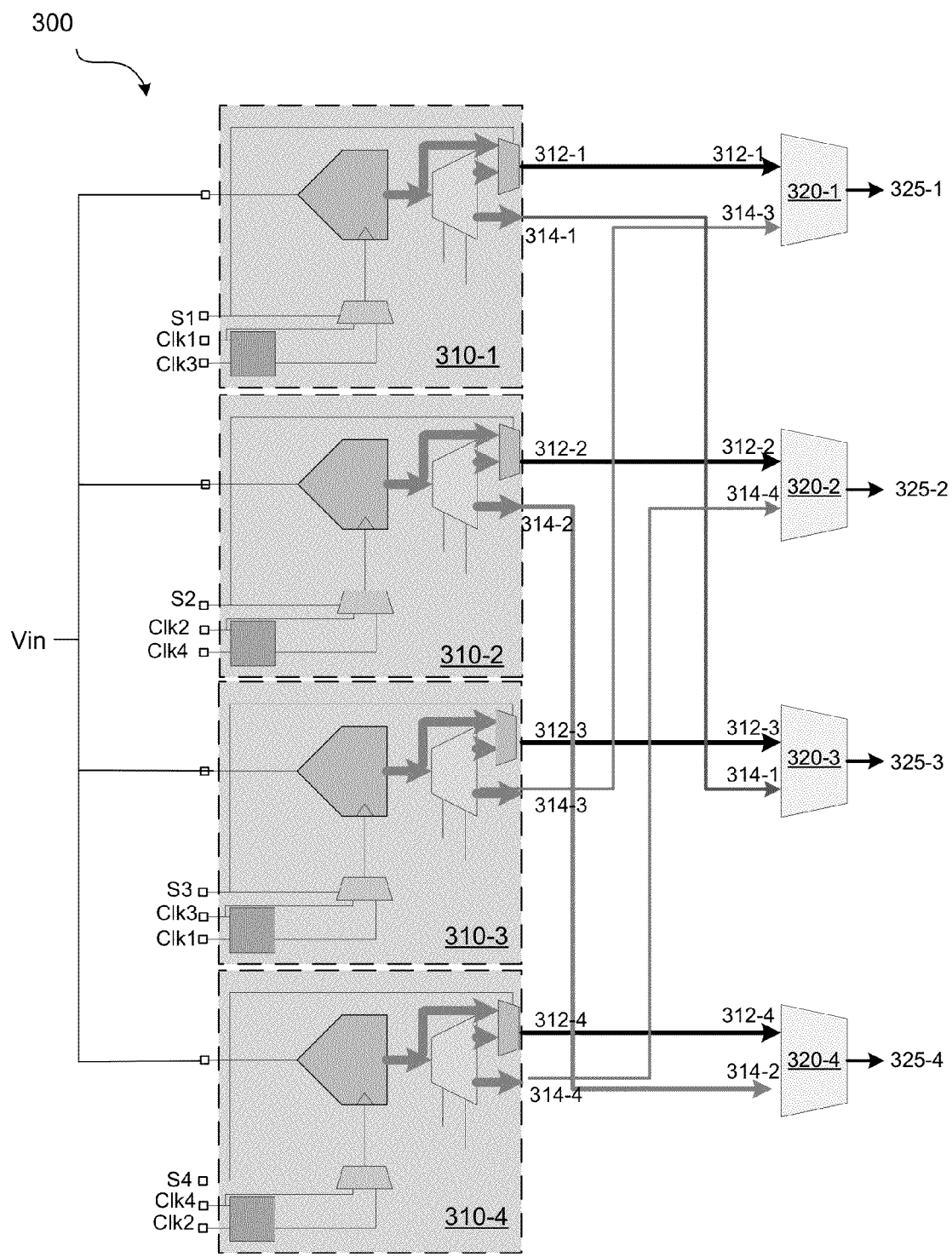
FIG. 3 is a block diagram of an example of a self-healing time-interleaved ADC quad.

FIG. 3 is a block diagram of an example of a self-healing time-interleaved ADC quad 300. The ADC quad 300 is used to describe an example use of the subject self-healing/electronic redundancy technique to compensate for a defective unit (e.g., a defective ADC slice) of a multi-unit mixed-signal system (e.g., an ADC, a DAC, or a SerDes with multiple similar units such as ADC slices of and ADC). The ADC quad 300 includes four ADC slices 310 (e.g., 310-1 to 310-4). Each ADC slice is the same as the ADC slice 200B of FIG. 2B and can operate in a normal or healing mode, as discussed above. For example, the ADC slice 310-1 can generate a single digital output signal 312-1, in the normal mode, or two digital output signals 312-1 and 314-1, in the healing mode. The mode of operation may be set by the mode select signals S1 to S4, which are in turn set by a calibration engine, not shown in FIG. 3 for clarity.

Four multiplexers 320 (e.g., 320-1 to 320-4) may select, for each ADC slice 310 one of a normal output 312 (312-1 to 312-4) or the redundant output 314 (314-1 to 314-4) generated by another ADC slice. For example, the redundant digital output signal 314-1, 314-2, 314-3 and 314-4 may, respectively, be applied to multiplexers 320-3, 320-4, 320-1, and 320-2. For instance, if ADC slice 310-2 goes bad, the corresponding normal output signal 312-2 may be lost and the calibration engine may set the mode select signal S4 to healing mode, so that the redundant output signal 314-4 be generated by the ADC slice 310-4 and provided to the multiplexer 320-2 to be passed as the output 325-2 of the defective ADC slice 2. Similarly, the output signals 325-1, 325-3 and, 325-4 of the ADC slices 310-1, 310-3, and 310-4 can be provides by ADC slices 310-3, 310-1, and 310-2, respectively.

In one or more implementation of the subject technology, other alternative arrangements for providing the electronic redundancy for each ADC slice using a different ADC slice than described above is possible. The arrangement, however, depends on the clock signals Clk1-Clk4 (e.g., of FIG. 2C) that are used for each ADC slice. For instance, the output redundancy arrangement described above can work because of the clock signal arrangement shown in FIG. 3, where, for example, Clk1 and Clk3 are coupled to ADC slice 310-1, and Clk3 and Clk1 (e.g., of FIG. 2C) are used as input clock signals of the ADC slice 310-3. It is seen that the clock signals Clk3 and Clk1 of the ADC slice 310-3 that supports (e.g., heals) the ADC slice 310-1, are at 180 degree phase angle with respect to the clock signals Clk1 and Clk3 of the ADC slice 310-1. Similarly, the clock signals Clk2 and Clk4 of the ADC slice 310-2 that supports (e.g., heals) the ADC slice 310-4, are at 180 degree phase angle with respect to the clock signals Clk4 and Clk2 of the ADC slice 310-4.

In one or more aspects, the disclosed electronic redundancy scheme can be used in larger ADCs than a quad ADC and can replace various physical redundancy schemes such a five-for-four, nine-for-eight, eleven-for ten, 13-for-12, and 17-for-16 schemes, etc. In one or more implementations, each ADC slice may be configured to support more than one defective ADC slices, for example, by configuring the respective SAR units to operate at higher sampling rates that the double-rate discussed above. In one or more aspects, the output redundancy arrangement described above may be reconfigurable such that when a ADC slice (e.g., 310-1) that provides support for another ADC slice (e.g., 310-3) goes bad, the other ADC slice (e.g., 310-3) can receive support from one of the ADC slice 310-2 or 310-4.

Figure 4:
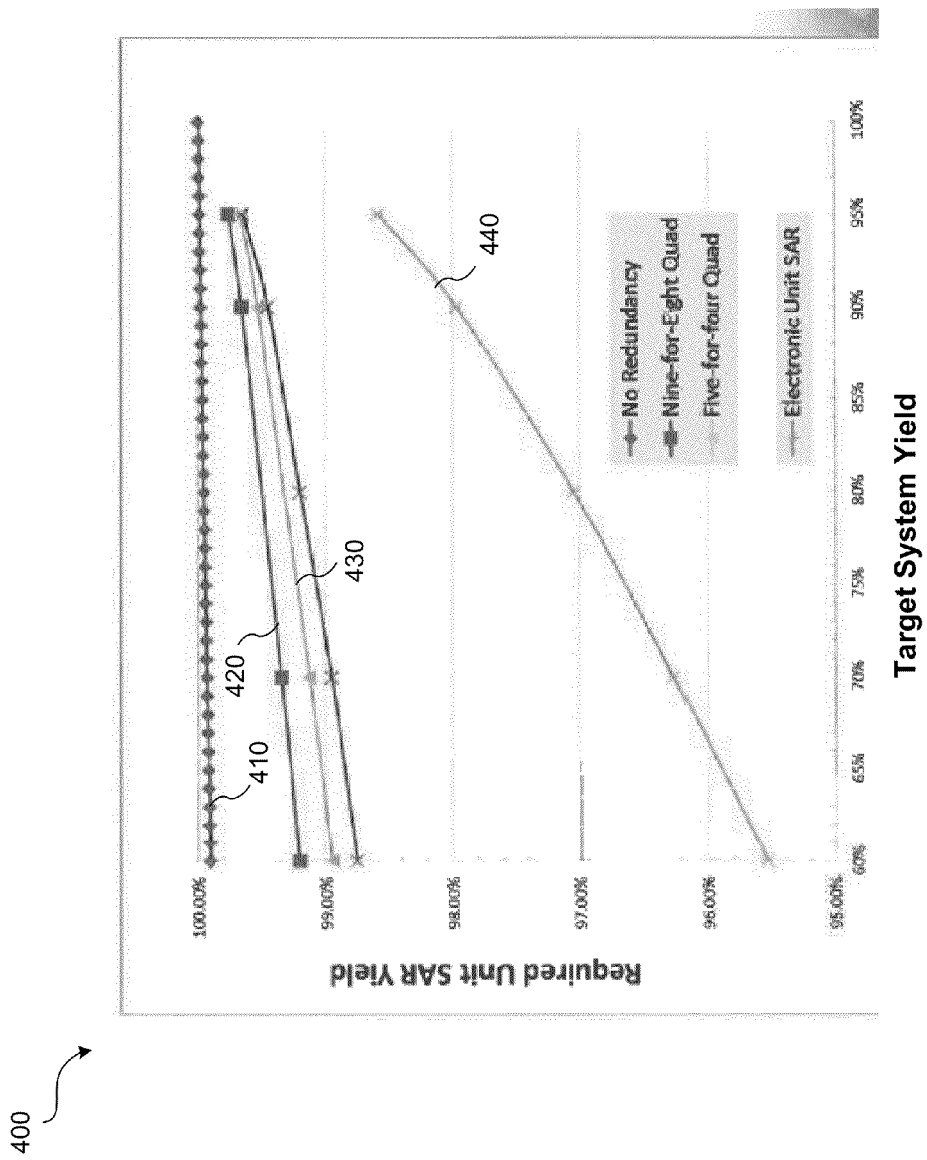
FIG. 4 is a diagram of an example of a yield-analysis plot for various redundancy configurations.

FIG. 4 is an example of a yield-analysis plot 400 for various redundancy configurations. The redundancy configurations corresponding to curves 410, 420, 430, and 440 are no-redundancy, nine-for-eight quad, five-for-four quad, and electronic redundancy, respectively. As shown by curve 410, for the no-redundancy scheme, the requirement on the unit SAR yield is the highest. In this scheme, to achieve a system yield (e.g., for an ADC quad 300 of FIG. 3) of only 60%, each SAR unit (e.g., a SAR slice 310 of FIG. 3) is required to have a high yield of close to 100%. The SAR unit yield requirement is shown to reduce as the order of redundancy is increased for quad ADCs. It is interesting to note that the electronic redundancy disclosed herein has the highest effect in reducing the required SAR unit yield. For example, for achieving a system yield of 60%, with the electronic redundancy scheme, as shown by the curve 440, a reduced SAR unit yield of close to 95% is sufficient, which is a notable improvement over other schemes that require close to 99% SAR unit yield.

Figure 5:
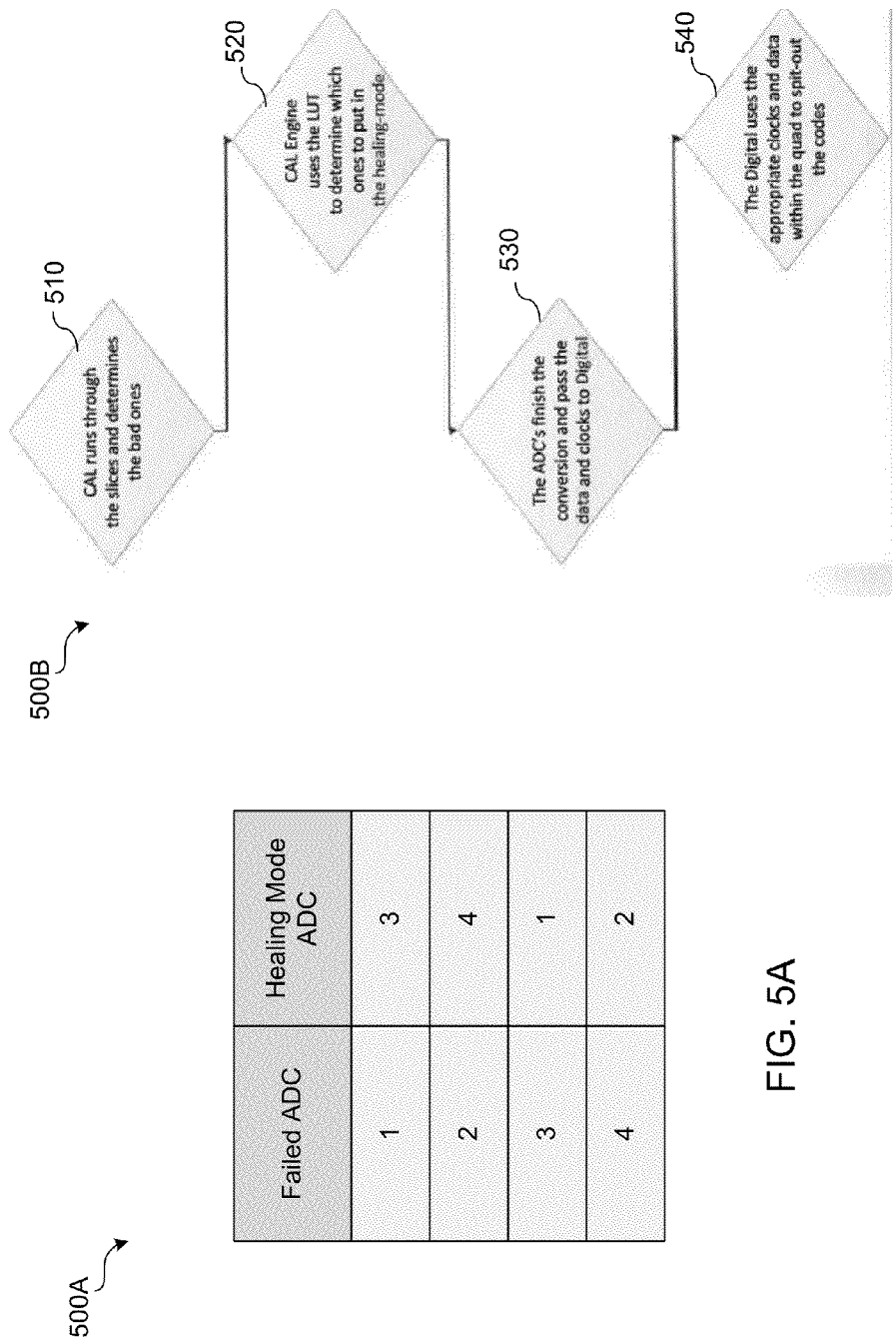
FIGS. 5A-5B are a look-up table and a flow diagram illustrating an example of an algorithm for operating the self-healing time-interleaved ADC quad of FIG. 3.

FIGS. 5A-5B are a look-up table 500A and a flow diagram 500B illustrating an example of an algorithm for operating the self-healing time-interleaved ADC quad 300 of FIG. 3. In the look-up table (LUT) 500A the numbers 1-4 refer to ADC slice number indices of FIG. 3. For example, numbers 1-4 represents ADC slice 310-1 to 310-4 of FIG. 3. The healing mode ADC column shows the ADC slice numbers for the replacement ADC slices corresponding to ADC slice numbers of the failed ADC column. For example, if ADC slice 310-2 is failed, according to the LUT 500A, the ADC slice 310-4 will provide the replacement for the lost digital output signal.

The flow diagram 500B describes an algorithm that can be run via a calibration (CAL) engine. The algorithm start at operation block 510, where a calibration run is performed that can scan through the ADC slices (e.g., ADC slices 310-1 to 310-4) and detect a defective (e.g., failed) ADC slice (e.g., ADC 310-2). At operation block 520, the CAL engine may use the LUT 500A to determine which ADC slice can be used in the healing mode to replace the lost digital output signal of the failed ADC slice. At operation block 530, the SAR units (e.g., 210 of FIGS. 2A and 2B) may finish the conversion process and pass the generated digital data and clocks to the subsequent digital blocks (e.g., 220 and 260 of FIGS. 2A and 2B) of the ADC slices. Finally, at operation block 540, the digital blocks use the appropriate clocks and data, as described above with respect to FIGS. 2A, 2B, and 3, to split out the digital output signals.

Figure 6:
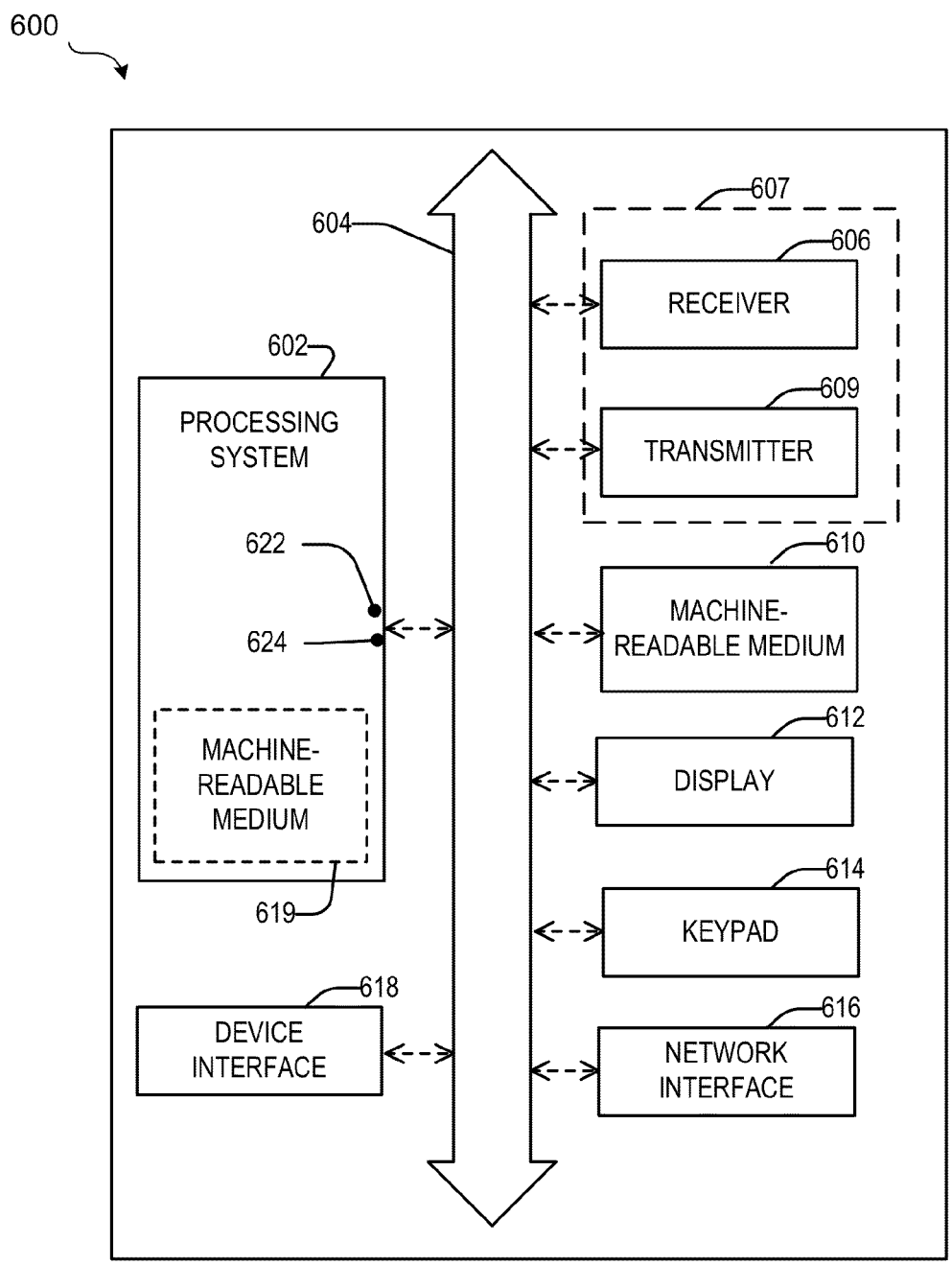
FIG. 6 is a conceptual block diagram of an example of a system using the self-healing time-interleaved ADC.

FIG. 6 is a conceptual block diagram of an example of a system using the self-healing time-interleaved ADC. The System 600 may include a mixed-signal system such as a communication system (e.g., a wireless, an optical, or other communication system) that includes the ADC quad 300 of FIG. 3. In one or more aspects, the communication system may include a handheld device, such as a cell phone, a tablet, or a laptop computer. The system 600 includes a processing system 602, which may include one or more processors or one or more processing systems. A processor can be one or more processors. The processing system 602 is capable of communication with a receiver 606 and a transmitter 609 through a bus 604 or other structures or devices. In one or more aspects, the transmitter 609 and the receiver 606 may include an ADC, a DAC, or a SerDes that uses the electronic redundancy schemes disclosed herein. It should be understood that communication means other than busses can be utilized with the disclosed configurations. Processing system 602 can perform the functionalities of the CAL engine discussed above. In some aspects, processing system 602 may generate audio, video, multimedia, and/or other types of data to be provided to the transmitter 609 for communication. In addition, audio, video, multimedia, and/or other types of data can be received at the receiver 606, and processed by the processing system 602.

The processing system 602 may include a general-purpose processor or a specific-purpose processor for executing instructions and may further include a machine-readable medium 619, such as a volatile or non-volatile memory, for storing data and/or instructions for software programs. The instructions, which may be stored in a machine-readable medium 610 and/or 619, may be executed by the processing system 602 to control and manage access to the various networks, as well as provide other communication and processing functions. The instructions may also include instructions executed by the processing system 602 for various user interface devices, such as a display 612 and a keypad 614. The processing system 602 may include an input port 622 and an output port 624. Each of the input port 622 and the output port 624 may include one or more ports. The input port 622 and the output port 624 may be the same port (e.g., a bi-directional port) or may be different ports.

The processing system 602 may be implemented using software, hardware, or a combination of both. By way of example, the processing system 602 may be implemented with one or more processors. A processor may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable device that can perform calculations or other manipulations of information.

A machine-readable medium can be one or more machine-readable media. Software shall be construed broadly to mean instructions, data, or any combination thereof, whether referred to as software, firmware, middleware, microcode, hardware description language, or otherwise. Instructions may include code (e.g., in source code format, binary code format, executable code format, or any other suitable format of code).

Machine-readable media (e.g., 619) may include storage integrated into a processing system such as might be the case with an ASIC. Machine-readable media (e.g., 610) may also include storage external to a processing system, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device. Those skilled in the art will recognize how best to implement the described functionality for the processing system 602. According to one aspect of the disclosure, a machine-readable medium is a computer-readable medium encoded or stored with instructions and is a computing element, which defines structural and functional interrelationships between the instructions and the rest of the system, which permit the instructions' functionality to be realized. Instructions may be executable, for example, by the processing system 602 or one or more processors. Instructions can be, for example, a computer program including code.

A network interface 616 may be any type of interface to a network (e.g., an Internet network interface), and may reside between any of the components shown in FIG. 6.

A device interface 618 may be any type of interface to a device and may reside between any of the components shown in FIG. 6. A device interface 618 may, for example, be an interface to an external device (e.g., USB device) that plugs into a port (e.g., USB port) of the system 600.

A transceiver block 607 may represent one or more transceivers, and each transceiver may include a receiver 606 and a transmitter 609. A functionality implemented in a processing system 602 may be implemented in a portion of a receiver 606, a portion of a transmitter 609, a portion of a machine-readable medium 610, a portion of a display 612, a portion of a keypad 614, or a portion of an interface 616, and vice versa.

Illustration of Subject Technology as Clauses

Various examples of aspects of the disclosure are described as numbered clauses (1, 2, 3, etc.) for convenience. These are provided as examples, and do not limit the subject technology. Identifications of the figures and reference numbers are provided below merely as examples and for illustrative purposes, and the clauses are not limited by those identifications.

1. A circuit for a time-interleaved analog-to-digital converter (ADC) with built-in self-healing (e.g., 300 of FIG. 3), comprising:
    a plurality of ADC slices (e.g., 310-1 to 310-4 of FIG. 3), each ADC slice configured to operate in one of a normal or a healing mode of operation;
        each ADC slice (e.g., 200A of FIG. 2A) being configured to convert, in the normal mode of operation, an input analog signal (e.g., Vin of FIG. 2A) to a single digital output signal (e.g., 262 of FIG. 2A), in response to a clock (e.g., 252 of FIG. 2A) signal associated with the ADC slice; and
        each ADC slice (e.g., 200B of FIG. 2B), being configured to be operable, in the healing mode of operation, to convert the input analog signal to two or more digital output signals (e.g., 262 and 224 of FIG. 2B) in response to two or more clock signals (e.g., 252 and 254 of FIG. 2B),
    wherein:
    at least one of the two or more digital output signals (e.g., 224 of FIG. 2B, or 314-1 of FIG. 3) is configurable to replace one or more output signals (e.g., 312-3 of FIG. 3) of one or more failed ADC slices (e.g., 310-3 of FIG. 3),
    a first clock signal (e.g., 252 of FIG. 2B) of the two or more clock signals is the clock signal associated with the ADC slice, and
    a second clock signal (e.g., 254 of FIG. 2B or Clk2 of FIG. 3) of the two or more clock signals is associated with another ADC slice (e.g., 310-2 of FIG. 3) of the plurality of ADC slices.

2. The circuit of clause 1 or any other clauses, wherein:
    the first clock signal comprises a predetermined phase angle,
    predetermined phase angles of clock signals associated with the plurality of ADC slices are different from one another,
    a count of the plurality of ADC slices is four, and
    the predetermined phase angles of the clock signals associated with the plurality of ADC slices comprise 0, 90, 180, and 270 degrees.

3. The circuit of clause 1 or any other clauses, wherein:
a sampling rate of the time-interleaved ADC is higher than a sampling rate of each of the ADC slices of the plurality of ADC slices, in the healing mode of operation, one or more of the ADC slices are operable to generate two or more digital output signals, and at least one of the two or more digital output signals is used to replace one or more output signals of one or more failed ADC slices, and the one or more failed ADC slices are detected by a calibration engine.

4. The circuit of clause 3 or any other clauses, wherein:
the calibration engine is configured to select one or more of the ADC slices for operation in the healing mode based on a look-up table, and the look-up table comprises information related to selection of the one or more of the ADC slices for operation in the healing mode based on the one or more failed ADC slices.

5. The circuit of clause 1 or any other clauses, wherein each ADC slice comprises:
a successive-approximation register (SAR) unit configured to convert the input analog signal to a digital signal, in response to a selected clock signal;
a clock circuit configured to generate the selected clock signal based on the two or more clock signals; and
a digital block comprising a multiplexer, a demultiplexer, and an inverter.

6. The circuit of clause 1 or any other clauses, wherein: each ADC slice comprises:
a successive-approximation register (SAR) unit configured to convert the input analog signal to a digital signal, in response to a selected clock signal;
a clock circuit configured to generate the selected clock signal based on the two or more clock signals; and
a digital block comprising a multiplexer, a demultiplexer, and an inverter,
in the normal mode of operation, the clock circuit is configured to pass the first clock signal to the SAR unit,
in the healing mode, the clock circuit is configured to pass a higher-rate clock signal to the SAR unit, and
a frequency of the higher-rate clock signal is twice or more of the frequency of the first clock signal.

7. The circuit of clause 6 or any other clauses, wherein:
the clock circuit comprises an OR gate and a clock-select multiplexer,
the OR gate is configured to generate the higher-rate clock signal by using the first clock signal and the second clock signal with a phase angle with respect to the first clock, and
the clock-select multiplexer is configured to select one of the first clock signal or the higher-rate clock signal based on a select signal.

8. The circuit of clause 1 or any other clauses, wherein: each ADC slice comprises:
a successive-approximation register (SAR) unit configured to convert the input analog signal to a digital signal, in response to a selected clock signal;
a clock circuit configured to generate the selected clock signal based on the two or more clock signals; and
a digital block comprising a multiplexer, a demultiplexer, and an inverter,
the inverter is configured to invert the first clock signal and provide an inverted first clock signal,
the demultiplexers is configured to generate a first and a second digital output signal from the digital signal generated by the SAR unit using the first clock signal and the inverted first clock signal, and the multiplexer is configured to pass, as an output signal, one of the first digital output signal or the digital signal generated by the SAR unit based on a mode select signal, 9. The circuit of clause 8 or any other clauses, wherein:
in the normal mode of operation, the single digital output signal of the ADC slice comprises the output signal of the multiplexer,
in the healing mode of operation, the two or more digital output signals of the ADC slice comprises the output signal of the multiplexer and the second digital output signal generated by the demultiplexer.

10. A method (e.g., 700 of FIG. 7) for self-healing in a time-interleaved analog-to-digital converter (ADC) (e.g., 300 of FIG. 3), comprising:
coupling a plurality of ADC slices to form the time-interleaved ADC (e.g., 710 of FIG. 7);
configuring each ADC slice to operate in one of a normal or a healing mode of operation (e.g., 720 of FIG. 7);
configuring each ADC slice (e.g., 730 of FIG. 7) to:
convert, in the normal mode of operation, an input analog signal to a single digital output signal in response to a clock signal associated with the ADC slice (e.g., 732 of FIG. 7); and
be operable to convert, in the healing mode of operation, the input analog signal to two or more digital output signals in response to two or more clock signals (e.g., 734 of FIG. 7),
wherein:
at least one of the two or more digital output signals is configurable to replace one or more output signals of one or more failed ADC slices,
a first clock signal of the two or more clock signals is the clock signal associated with the ADC slice, and
a second clock signal of the two or more clock signals is associated with another ADC slice of the plurality of ADC slices.

11. The method of clause 10 or any other clauses, further comprising using a clock signal with a predetermined phase angle as the first clock signal, and wherein:
predetermined phase angles of clock signals associated with the plurality of ADC slices are different from one another,
a count of the plurality of ADC slices is four, and
the predetermined phase angles of the clock signals associated with the plurality of ADC slices comprise 0, 90, 180, and 270 degrees.

12. The method of clause 10 or any other clauses, wherein:
a sampling rate of the time-interleaved ADC is higher than a sampling rate of each of the ADC slices of the plurality of ADC slices, and
the method further comprises:
operating, in the healing mode of operation, one or more of the plurality of ADC slices to generate two or more digital output signals, and using at least one of the two or more digital output signals to replace one or more output signals of one or more failed ADC slices, and
detecting, by performing a calibration, the one or more failed ADC slices.

13. The method of clause 10 or any other clauses, further comprising:
detecting, by performing calibration, the one or more failed ADC slices; and
selecting one or more of the plurality of ADC slices for operation in the healing mode based on a look-up table, wherein the look-up table comprises information related to selection of the one or more of the plurality of ADC slices for operation in the healing mode based on the one or more failed ADC slices.

14. The method of clause 10 or any other clauses, wherein coupling the plurality of ADC slices comprises coupling the plurality of ADC slices that comprise a successive-approximation register (SAR) unit, a clock circuit, and a digital block, and wherein the method further comprises:
configuring the SAR unit to convert the input analog signal to a digital signal, in response to a selected clock signal;
configuring a clock circuit to generate the selected clock signal based on the two or more clock signals, and
forming the digital block by using a multiplexer, a demultiplexer, and an inverter.

15. The method of clause 10 or any other clauses, wherein coupling the plurality of ADC slices comprises coupling the plurality of ADC slices, each ADC slice comprising a successive-approximation register (SAR) unit, a clock circuit, and a digital block, and wherein the method further comprises:
configuring the SAR unit to convert the input analog signal to a digital signal, in response to a selected clock signal;
configuring a clock circuit to generate the selected clock signal based on the two or more clock signals;
forming the digital block by using a multiplexer, a demultiplexer, and an inverter;
configuring, in the normal mode of operation, the clock circuit to pass the first clock signal to the SAR unit; and
configuring, in the healing mode of operation, the clock circuit to pass a higher-rate clock signal to the SAR unit,
wherein a frequency of the higher-rate clock signal is twice or more of the frequency of the first clock signal.

16. The method of clause 10 or any other clauses, further comprising:
forming the clock circuit by using an OR gate and a clock-select multiplexer,
configuring the OR gate to generate the higher-rate clock signal by using the first clock signal and the second clock signal with a phase angle with respect to the first clock, and
configuring the clock-select multiplexer to select one of the first clock signal or the higher-rate clock signal based on a select signal.

17. The method of clause 10 or any other clauses, wherein coupling the plurality of ADC slices comprises coupling the plurality of ADC slices that comprise a successive-approximation register (SAR) unit, a clock circuit, and a digital block, and wherein the method further comprises:
configuring the SAR unit to convert the input analog signal to a digital signal, in response to a selected clock signal;
configuring a clock circuit to generate the selected clock signal based on the two or more clock signals;
forming the digital block by using a multiplexer, a demultiplexer, and an inverter;
configuring the inverter to invert the first clock signal and providing an inverted first clock signal;
configuring the demultiplexers to generate a first and a second digital output signal from the digital signal generated by the SAR unit by using the first clock signal and the inverted first clock signal; and
configuring the multiplexer to pass, as an output signal, one of the first digital output signal or the digital signal generated by the SAR unit based on a mode select signal.

18. The method of clause 17 or any other clauses, further comprising:
in the normal mode of operation, using the output signal of the multiplexer as the single digital output signal of the ADC slice;

in the healing mode of operation, using the output signal of the multiplexer and the second digital output signal generated by the demultiplexer as the two or more digital output signals of the ADC slice comprises.

19. A non-transitory machine-readable medium (e.g., 610 of FIG. 6) comprising instructions stored therein, the instructions executable by one or more processors to facilitate performing a method (e.g., 700 of FIG. 7) for self-healing in a time-interleaved analog-to-digital converter (ADC), the method comprising:
coupling a plurality of ADC slices to form the time-interleaved ADC;
configuring each ADC slice to operate in one of a normal or a healing mode of operation;
configuring each ADC slice to:
convert, in the normal mode of operation, an input analog signal to a single digital output signal in response to a clock signal associated with the ADC slice; and
be operable to convert, in the healing mode of operation, the input analog signal to two or more digital output signals in response to two or more clock signals,
wherein:
at least one of the two or more digital output signals is configurable to replace one or more output signals of one or more failed ADC slices,
a first clock signal of the two or more clock signals is the clock signal associated with the ADC slice, and
a second clock signal of the two or more clock signals is associated with another ADC slice of the plurality of ADC slices.

20. The non-transitory machine-readable medium of clause 19 or any other clauses, wherein the method further comprises:
operating, in the healing mode of operation, one or more of the ADC slices to generate two or more digital output signals to compensate for one or more failed ADC slices;
detecting, by performing a calibration, the one or more failed ADC slices;
selecting one or more of the ADC slices for operation in the healing mode based on a look-up table; wherein the look-up table comprises information related to selection of the one or more of the ADC slices for operation in the healing mode based on the one or more failed ADC slices;
configuring a SAR unit of each ADC slice to convert the input analog signal to a digital signal, in response to a selected clock signal; and
configuring a clock circuit of each ADC slice to generate the selected clock signal based on the two or more clock signals, wherein in the healing mode of operation, the selected clock signal is a higher-rate clock signal that when applied to the SAR unit causes the SAR unit to operate at the higher rate, and wherein the higher rate is twice a normal rate of operation of the SAR unit, when operating in a normal mode of operation.

21. A hardware apparatus (e.g., 800 of FIG. 8) comprising modules comprising:
means for coupling a plurality of ADC slices to form the time-interleaved ADC (e.g., 810 of FIG. 8);
means for configuring each ADC slice to operate in one of a normal or a healing mode of operation (e.g., 820 of FIG. 8);
means for configuring each ADC slice (e.g., 830 of FIG. 8) comprising:
means for converting, in the normal mode of operation, an input analog signal to a single digital output signal in response to a clock signal associated with the ADC slice (e.g., 832 of FIG. 8); and means for being operable to convert, in the healing mode of operation, the input analog signal to two or more digital output signals in response to two or more clock signals (e.g., 834 of FIG. 8), wherein:

at least one of the two or more digital output signals is configurable to replace one or more output signals of one or more failed ADC slices, a first clock signal of the two or more clock signals is the clock signal associated with the ADC slice, and a second clock signal of the two or more clock signals is associated with another ADC slice of the plurality of ADC slices.

22. A hardware apparatus comprising circuits configured to perform one or more methods or operations of any one of clauses 10-20 (e.g., Apparatus of FIG. 3) or any other clauses.

23. A circuit comprising means adapted for performing one or more methods or operations of any one of clauses 10-20 (e.g., Apparatus of FIG. 8) or any other clauses.

In one aspect, any of the clauses herein may depend from any one of the independent clauses or any one of the dependent clauses. In one aspect, any of the clauses (e.g., dependent or independent clauses) may be combined with any other clauses (e.g., dependent or independent clauses). In one aspect, a claim may include some or all of the words (e.g., steps, operations, means or components) recited in a clause, a sentence, a phrase or a paragraph. In one aspect, a claim may include some or all of the words recited in one or more clauses, sentences, phrases or paragraphs. In one aspect, some of the words in each of the clauses, sentences, phrases or paragraphs may be removed. In one aspect, additional words or elements may be added to a clause, a sentence, a phrase or a paragraph. In one aspect, the subject technology may be implemented without utilizing some of the components, elements, functions or operations described herein. In one aspect, the subject technology may be implemented utilizing additional components, elements, functions or operations.

In one aspect, any methods, instructions, code, means, logic, components, blocks, modules and the like (e.g., software or hardware) described or claimed herein can be represented in drawings (e.g., flow charts, block diagrams), such drawings (regardless of whether explicitly shown or not) are expressly incorporated herein by reference, and such drawings (if not yet explicitly shown) can be added to the disclosure without constituting new matter. For brevity, some (but not necessarily all) of the clauses/descriptions/claims are explicitly represented in drawings, but any of the clauses/descriptions/claims can be represented in drawings in a manner similar to those drawings explicitly shown. For example, a flow chart can be drawn for any of the clauses, sentences or claims for a method such that each operation or step is connected to the next operation or step by an arrow. In another example, a block diagram can be drawn for any of the clauses, sentences or claims having means-for elements (e.g., means for performing an action) such that each means-for element can be represented as a module for element (e.g., a module for performing an action).

Those of skill in the art would appreciate that items such as the various illustrative blocks, modules, elements, components, methods, operations, steps, and algorithms described herein may be implemented as hardware or a combination of f hardware and software.

To illustrate the interchangeability of hardware and software, items such as the various illustrative blocks, modules, elements, components, methods, operations, steps, and algorithms have been described generally in terms of their functionality. Whether such functionality is implemented as hardware or software depends upon the particular application and design constraints imposed on the overall system. Skilled artisans may implement the described functionality in varying ways for each particular application.

In one aspect, "means," a block, a module, an element, a component or a processor may be an item (e.g., one or more of blocks, modules, elements, components or processors) for performing one or more functions or operations. In one aspect, such an item may be an apparatus, hardware, or a portion thereof. In an example, an item may be implemented as one or more circuits configured to perform the function(s) or operation(s). A circuit may include one or more circuits and/or logic. A circuit may be analog and/or digital. A circuit may be electrical and/or optical. A circuit may include transistors. In an example, one or more items may be implemented as a processing system (e.g., a digital signal processor (DSP), an application specific integrated circuit (ASIC), a field programmable gate array (FPGA), etc.). In one example, an item may also include a structure in the form of, for example, an instruction(s) for performing the function(s) or operation(s), where the instruction(s) are encoded or stored on a machine-readable medium, on another device, or on a portion thereof, where an instruction(s) may be software, an application(s), a subroutine(s), or a portion thereof. Those skilled in the art will recognize how to implement the instructions, circuits, and processing systems.

A reference to an element in the singular is not intended to mean "one and only one" unless specifically so stated, but rather "one or more." For example, a clock signal may refer to one or more clock signals, a control signal may refer to one or more control signals, an input signal may refer to one or more input signals, an output signal may refer to one or more output signals, and a signal may refer to differential voltage signals.

Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The word "exemplary" is used herein to mean "serving as an example or illustration." Any aspect or design described herein as "exemplary" is not necessarily to be construed as preferred or advantageous over other aspects or designs. In one aspect, various alternative configurations and operations described herein may be considered to be at least equivalent.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

In one aspect of the disclosure, when actions or functions are described as being performed by an item (e.g., receiving, determining, providing, generating, converting, displaying, notifying, accepting, selecting, controlling, transmitting, reporting, sending, or any other action or function), it is understood that such actions or functions may be performed by the item directly or indirectly. In one aspect, when a module is described as performing an action, the module may be understood to perform the action directly. In one aspect, when a module is described as performing an action, the module may be understood to perform the action indirectly, for example, by facilitating, enabling or causing such an action.

In one aspect, unless otherwise stated, all measurements, values, ratings, positions, magnitudes, sizes, and other specifications that are set forth in this specification, including in the claims that follow, are approximate, not exact. In one aspect, they are intended to have a reasonable range that is consistent with the functions to which they relate and with what is customary in the art to which they pertain.

In one aspect, the term "coupled" or the like may refer to being directly coupled. In another aspect, the term "coupled" or the like may refer to being indirectly coupled.

Various items may be arranged differently (e.g., arranged in a different order, or partitioned in a different way) all without departing from the scope of the subject technology. In one aspect of the disclosure, the elements recited in the accompanying claims may be performed by one or more modules or sub-modules.

It is understood that the specific order or hierarchy of steps, operations or processes disclosed is an illustration of exemplary approaches. Based upon design preferences, it is understood that the specific order or hierarchy of steps, operations or processes may be rearranged. Some of the steps, operations or processes may be performed simultaneously. Some or all of the steps, operations, or processes may be performed automatically, without the intervention of a user. The accompanying method claims, if any, present elements of the various steps, operations or processes in a sample order, and are not meant to be limited to the specific order or hierarchy presented.

The disclosure is provided to enable any person skilled in the art to practice the various aspects described herein. The disclosure provides various examples of the subject technology, and the subject technology is not limited to these examples. Various modifications to these aspects will be readily apparent to those skilled in the art, and the generic principles defined herein may be applied to other aspects.

In one aspect, a transistor may refer to a bipolar junction transistor, a field effect transistor, or the like. In one aspect, capacitors and resistors may be implemented using transistor or diode elements. The subject technology, however, is not limited to these exemplary numbers, and can be implemented with other numbers of bits or components.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used, such term is intended to be inclusive in a manner similar to the term "comprise" as "comprise" is interpreted when employed as a transitional word in a claim.

The Title, Background, Summary, Brief Description of the Drawings and Abstract of the disclosure are hereby incorporated into the disclosure and are provided as illustrative examples of the disclosure, not as restrictive descriptions. It is submitted with the understanding that they will not be used to limit the scope or meaning of the claims. In addition, in the Detailed Description, it can be seen that the description provides illustrative examples and the various features are grouped together in various embodiments for the purpose of streamlining the disclosure. This method of disclosure is not to be interpreted as reflecting an intention that the claimed subject matter requires more features than are expressly recited in each claim. Rather, as the following claims reflect, inventive subject matter lies in less than all features of a single disclosed configuration or operation. The following claims are hereby incorporated into the Detailed Description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirement of 35 U.S.C. §101, 102, or 103, nor should they be interpreted in such a way. Any unintended embracement of such subject matter is hereby disclaimed.

What is claimed is:

1. A circuit for a time-interleaved analog-to-digital converter (ADC) with built-in self-healing, comprising:
    a plurality of ADC slices, each ADC slice configured to operate in one of a normal or a healing mode of operation;
        each ADC slice being configured to convert, in the normal mode of operation, an input analog signal to a single digital output signal in response to a clock signal associated with the ADC slice; and
        each ADC slice being configured to be operable, in the healing mode of operation, to convert the input analog signal to two or more digital output signals in response to two or more clock signals,
    wherein:
    the circuit is configured to allow at least one of the two or more digital output signals to replace one or more output signals of one or more failed ADC slices,
    a first clock signal of the two or more clock signals is the clock signal associated with the ADC slice, and
    a second clock signal of the two or more clock signals is associated with another ADC slice of the plurality of ADC slices.

2. The circuit of claim 1, wherein:
    the first clock signal comprises a predetermined phase angle,
    predetermined phase angles of clock signals associated with the plurality of ADC slices are different from one another,
    a count of the plurality of ADC slices is four, and
    the predetermined phase angles of the clock signals associated with the plurality of ADC slices comprise 0, 90, 180, and 270 degrees.

3. The circuit of claim 1, wherein:
    a sampling rate of the time-interleaved ADC is higher than a sampling rate of each of the ADC slices of the plurality of ADC slices, in the healing mode of operation, one or more of the plurality of ADC slices are operable to generate two or more digital output signals, and at least one of the two or more digital output signals is used to replace one or more output signals of one or more failed ADC slices, and
the one or more failed ADC slices are detected by a calibration engine.

4. The circuit of claim 3, wherein:
the calibration engine is configured to select one or more of the plurality of ADC slices for operation in the healing mode based on a look-up table, and
the look-up table comprises information related to selection of the one or more of the plurality of ADC slices for operation in the healing mode based on the one or more failed ADC slices.

5. The circuit of claim 1, wherein each ADC slice comprises:
a successive-approximation register (SAR) unit configured to convert the input analog signal to a digital signal, in response to a selected clock signal;
a clock circuit configured to generate the selected clock signal based on the two or more clock signals; and
a digital block comprising a multiplexer, a demultiplexer, and an inverter.

6. The circuit of claim 1, wherein:
each ADC slice comprises:
a successive-approximation register (SAR) unit configured to convert the input analog signal to a digital signal, in response to a selected clock signal;
a clock circuit configured to generate the selected clock signal based on the two or more clock signals; and
a digital block comprising a multiplexer, a demultiplexer, and an inverter,
in the normal mode of operation, the clock circuit is configured to pass the first clock signal to the SAR unit,
in the healing mode, the clock circuit is configured to pass a higher-rate clock signal to the SAR unit, and
a frequency of the higher-rate clock signal is twice or more of the frequency of the first clock signal.

7. The circuit of claim 6, wherein:
the clock circuit comprises an OR gate and a clock-select multiplexer,
the OR gate is configured to generate the higher-rate clock signal by using the first clock signal and the second clock signal with a phase angle with respect to the first clock, and
the clock-select multiplexer is configured to select one of the first clock signal or the higher-rate clock signal based on a select signal.

8. The circuit of claim 1, wherein:
each ADC slice comprises:
a successive-approximation register (SAR) unit configured to convert the input analog signal to a digital signal, in response to a selected clock signal;
a clock circuit configured to generate the selected clock signal based on the two or more clock signals; and
a digital block comprising a multiplexer, a demultiplexer, and an inverter,
the inverter is configured to invert the first clock signal and provide an inverted first clock signal,
the demultiplexers is configured to generate a first and a second digital output signal from the digital signal generated by the SAR unit using the first clock signal and the inverted first clock signal, and
the multiplexer is configured to pass, as an output signal, one of the first digital output signal or the digital signal generated by the SAR unit based on a mode select signal.

9. The circuit of claim 8, wherein:
in the normal mode of operation, the single digital output signal of the ADC slice comprises the output signal of the multiplexer,
in the healing mode of operation, the two or more digital output signals of the ADC slice comprises the output signal of the multiplexer and the second digital output signal generated by the demultiplexer.

10. A method for self-healing in a time-interleaved analog-to-digital converter (ADC), comprising:
coupling a plurality of ADC slices to form the time-interleaved ADC;
configuring each ADC slice to operate in one of a normal or a healing mode of operation;
configuring each ADC slice to:
convert, in the normal mode of operation, an input analog signal to a single digital output signal in response to a clock signal associated with the ADC slice; and
be operable to convert, in the healing mode of operation, the input analog signal to two or more digital output signals in response to two or more clock signals,
wherein:
at least one of the two or more digital output signals is configurable to replace one or more output signals of one or more failed ADC slices,
a first clock signal of the two or more clock signals is the clock signal associated with the ADC slice, and
a second clock signal of the two or more clock signals is associated with another ADC slice of the plurality of ADC slices.

11. The method of claim 10, further comprising using a clock signal with a predetermined phase angle as the first clock signal, and wherein:
predetermined phase angles of clock signals associated with the plurality of ADC slices are different from one another,
a count of the plurality of ADC slices is four, and
the predetermined phase angles of the clock signals associated with the plurality of ADC slices comprise 0, 90, 180, and 270 degrees.

12. The method of claim 10, wherein:
a sampling rate of the time-interleaved ADC is higher than a sampling rate of each of the ADC slices of the plurality of ADC slices, and
the method further comprises:
operating, in the healing mode of operation, one or more of the plurality of ADC slices to generate two or more digital output signals, and using at least one of the two or more digital output signals to replace one or more output signals of one or more failed ADC slices, and
detecting, by performing a calibration, the one or more failed ADC slices.

13. The method of claim 10, further comprising:
detecting, by performing calibration, the one or more failed ADC slices; and
selecting one or more of the plurality of ADC slices for operation in the healing mode based on a look-up table,
wherein the look-up table comprises information related to selection of the one or more of the plurality of ADC slices for operation in the healing mode based on the one or more failed ADC slices.

14. The method of claim 10, wherein coupling the plurality of ADC slices comprises coupling the plurality of ADC slices that comprise a successive-approximation register (SAR) unit, a clock circuit, and a digital block, and wherein the method further comprises:

configuring the SAR unit to convert the input analog signal to a digital signal, in response to a selected clock signal;
configuring a clock circuit to generate the selected clock signal based on the two or more clock signals, and
forming the digital block by using a multiplexer, a demultiplexer, and an inverter.

15. The method of claim 10, wherein coupling the plurality of ADC slices comprises coupling the plurality of ADC slices, each ADC slice comprising a successive-approximation register (SAR) unit, a clock circuit, and a digital block, and wherein the method further comprises:
configuring the SAR unit to convert the input analog signal to a digital signal, in response to a selected clock signal;
configuring a clock circuit to generate the selected clock signal based on the two or more clock signals;
forming the digital block by using a multiplexer, a demultiplexer, and an inverter;
configuring, in the normal mode of operation, the clock circuit to pass the first clock signal to the SAR unit; and
configuring, in the healing mode of operation, the clock circuit to pass a higher-rate clock signal to the SAR unit, wherein a frequency of the higher-rate clock signal is twice or more of the frequency of the first clock signal.

16. The method of claim 15, further comprising:
forming the clock circuit by using an OR gate and a clock-select multiplexer,
configuring the OR gate to generate the higher-rate clock signal by using the first clock signal and the second clock signal with a phase angle with respect to the first clock, and
configuring the clock-select multiplexer to select one of the first clock signal or the higher-rate clock signal based on a select signal.

17. The method of claim 10, wherein coupling the plurality of ADC slices comprises coupling the plurality of ADC slices that comprise a successive-approximation register (SAR) unit, a clock circuit, and a digital block, and wherein the method further comprises:
configuring the SAR unit to convert the input analog signal to a digital signal, in response to a selected clock signal;
configuring a clock circuit to generate the selected clock signal based on the two or more clock signals;
forming the digital block by using a multiplexer, a demultiplexer, and an inverter;
configuring the inverter to invert the first clock signal and providing an inverted first clock signal;
configuring the demultiplexers to generate a first and a second digital output signal from the digital signal generated by the SAR unit by using the first clock signal and the inverted first clock signal; and
configuring the multiplexer to pass, as an output signal, one of the first digital output signal or the digital signal generated by the SAR unit based on a mode select signal.

18. The method of claim 17, further comprising:
in the normal mode of operation, using the output signal of the multiplexer as the single digital output signal of the ADC slice;
in the healing mode of operation, using the output signal of the multiplexer and the second digital output signal generated by the demultiplexer as the two or more digital output signals of the ADC slice comprises.

19. A non-transitory machine-readable medium comprising instructions stored therein, the instructions executable by one or more processors to facilitate performing a method for self-healing in a time-interleaved analog-to-digital converter (ADC), the method comprising:
coupling a plurality of ADC slices to form the time-interleaved ADC;
configuring each ADC slice to operate in one of a normal or a healing mode of operation;
configuring each ADC slice to:
convert, in the normal mode of operation, an input analog signal to a single digital output signal in response to a clock signal associated with the ADC slice; and
be operable to convert, in the healing mode of operation, the input analog signal to two or more digital output signals in response to two or more clock signals,
wherein:
at least one of the two or more digital output signals is configurable to replace one or more output signals of one or more failed ADC slices,
a first clock signal of the two or more clock signals is the clock signal associated with the ADC slice, and
a second clock signal of the two or more clock signals is associated with another ADC slice of the plurality of ADC slices.

20. The non-transitory machine-readable medium of claim 19, wherein the method further comprises:
operating, in the healing mode of operation, one or more of the plurality of ADC slices to generate two or more digital output signals to compensate for one or more failed ADC slices;
detecting, by performing a calibration, the one or more failed ADC slices;
selecting one or more of the plurality of ADC slices for operation in the healing mode based on a look-up table; wherein the look-up table comprises information related to selection of the one or more of the plurality of ADC slices for operation in the healing mode based on the one or more failed ADC slices;
configuring a SAR unit of each ADC slice to convert the input analog signal to a digital signal, in response to a selected clock signal; and
configuring a clock circuit of each ADC slice to generate the selected clock signal based on the two or more clock signals, wherein in the healing mode of operation, the selected clock signal is a higher-rate clock signal that when applied to the SAR unit causes the SAR unit to operate at the higher rate, and wherein the higher rate is twice a normal rate of operation of the SAR unit, when operating in a normal mode of operation.

* * * * *